United States Patent [19]
Blauvelt et al.

[11] Patent Number: 5,132,639
[45] Date of Patent: * Jul. 21, 1992

[54] PREDISTORTER FOR LINEARIZATION OF ELECTRONIC AND OPTICAL SIGNALS

[75] Inventors: Henry A. Blauvelt; Howard L. Loboda, both of Los Angeles; John S. Frame, Torrance, all of Calif.

[73] Assignee: Ortel Corporation, Alhambra, Calif.

[*] Notice: The portion of the term of this patent subsequent to Feb. 12, 2008 has been disclaimed.

[21] Appl. No.: 653,003

[22] Filed: Feb. 8, 1991

Related U.S. Application Data

[63] Continuation-in-part of Ser. No. 404,186, Sep. 7, 1989, Pat. No. 4,992,754.

[51] Int. Cl.$^5$ .............................................. H03F 1/32
[52] U.S. Cl. ...................................... 330/149; 328/163
[58] Field of Search ............... 330/149; 328/143, 144, 328/163; 332/160; 455/50, 63

[56] References Cited

U.S. PATENT DOCUMENTS

| | | | |
|---|---|---|---|
| 3,162,819 | 12/1964 | Wintringham | 329/145 |
| 3,961,172 | 6/1976 | Hutcheon | 235/181 |
| 4,035,735 | 7/1977 | Akashi et al. | 329/50 |
| 4,068,186 | 1/1978 | Sata et al. | 330/149 |
| 4,166,251 | 8/1979 | Ishigaki et al. | 329/132 |
| 4,195,360 | 3/1980 | Fothergill | 367/136 |
| 4,408,352 | 10/1983 | Dudding | 455/295 |
| 4,561,113 | 12/1985 | Naito | 455/205 |
| 4,577,342 | 3/1986 | Naito | 381/13 |
| 4,992,754 | 2/1991 | Blauvelt et al. | 330/149 |

OTHER PUBLICATIONS

Prochazka et al., "Amplifier Linearization by Complementary Pre- or Post-Distortion*", IEEE Transactions on Cable Television, vol. CATV-1, No. 1, Oct. 1976, pp. 31–39.
Asatani et al., "Linearization of LED Nonlinearity by Predistortions", IEEE Transactions on Electron Devices, vol. Ed-25, No. 2, Feb. 1978, pp. 207–212.
Childs et al., "WH 6 Predistortion Linearization of Directly Modulated DFB Lasers and External Modulators for AM Video Transmission", OFC/Wednesday Afternoon/79, one page.
Bertelsmeier et al., "Linearization of Broadband Optical Transmission Systems by Adaptive Predistortion", Frequenz 38(1984)9, pp. 206–212 (plus one page).

*Primary Examiner*—James B. Mullins
*Attorney, Agent, or Firm*—Christie, Parker & Hale

[57] ABSTRACT

An electronic circuit provides a linear output from an amplitude modulated transmission device such as a semiconductor laser which has inherent distortion. The distortion of the nonlinear device is compensated by applying a predistorted signal equal in magnitude and opposite in sign to the distortion introduced by the nonlinear device. The input signal is split into two or three paths with primary part of the signal applied directly to the device, with a time delay to compensate for delays in two secondary paths. One secondary path generates even order intermodulation products and the other generates odd order intermodulation products. These are recombined with the primary signal in proper phase and amplitude for cancelling distortion in the output device. A distortion generator in each secondary path generates adjustable amplitude intermodulation signals. A tilt adjustment is made to compensate the amplitude of the predistortion for frequency dependence of the amplitude of the distortion. Phase of the distortion signal is adjusted to be in proper phase relation with the distortion of the device. In the even order path there are means for adjusting predistortion at an intermediate frequency so that the distortion is cancelled near the upper, lower and intermediate portions of the frequency range of the device.

28 Claims, 5 Drawing Sheets

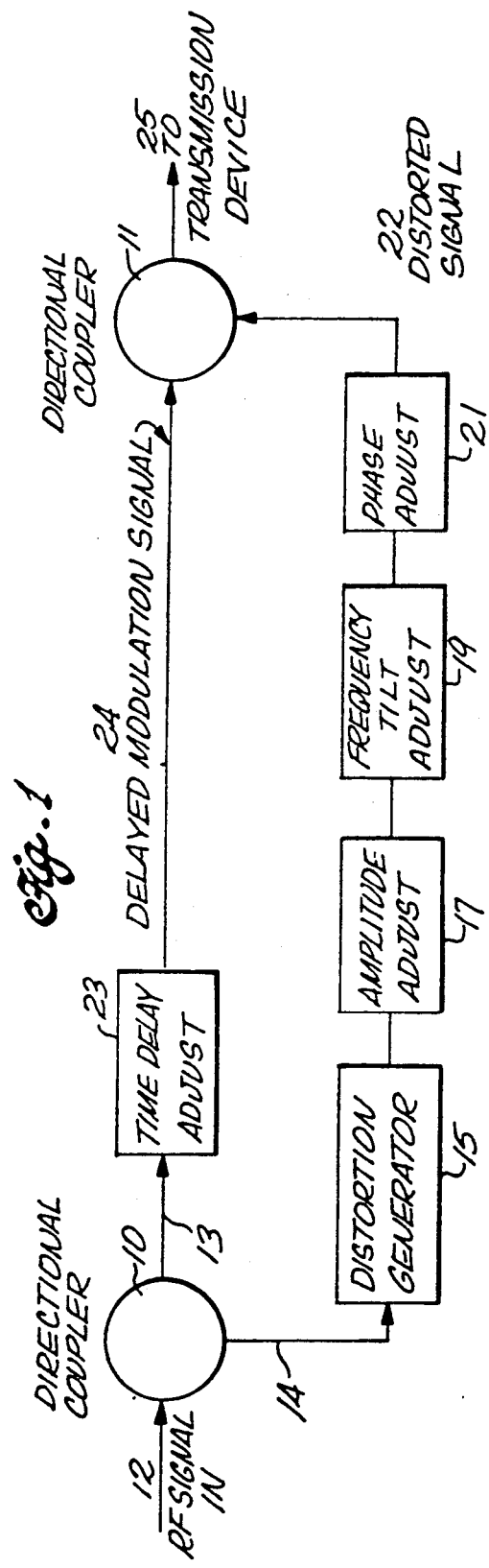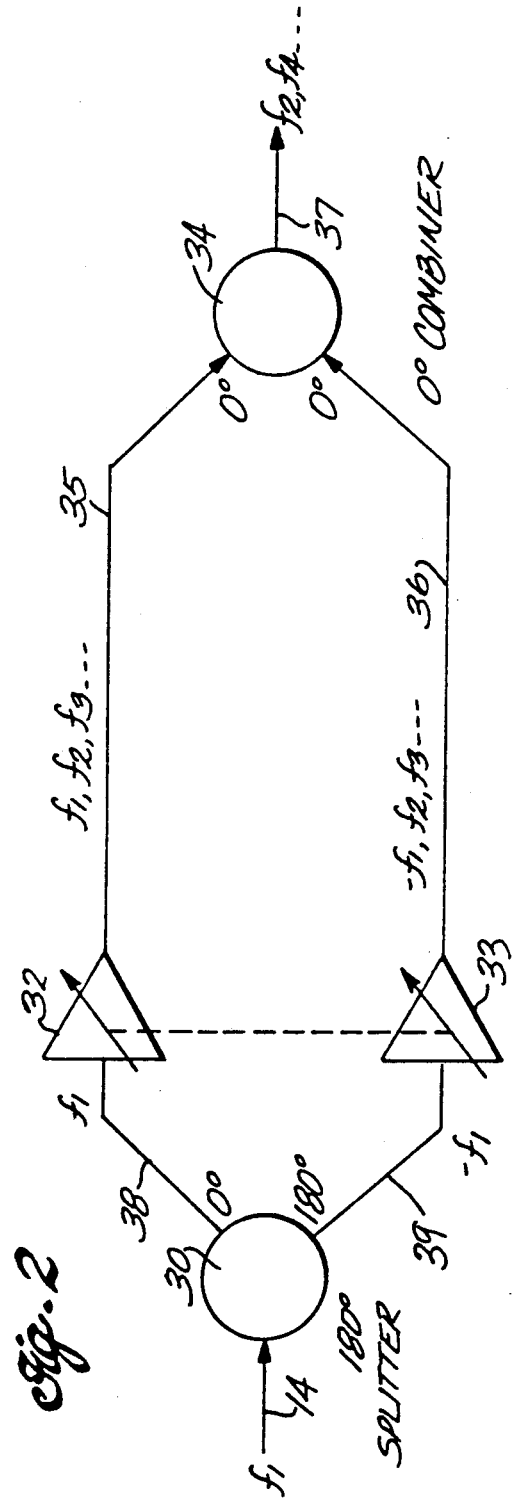

PREDISTORTER FOR LINEARIZATION OF ELECTRONIC AND OPTICAL SIGNALS

CROSS REFERENCE TO RELATED APPLICATION

This application is a continuation-in-part of U.S. patent application Ser. No. 07/404,186, filed Sep. 7, 1989, now U.S. Pat. No. 4,992,754.

FIELD OF THE INVENTION

This invention relates to an electronic circuit for providing a linear output from an amplitude modulated transmission device such as a semiconductor laser which has an output distorted from its input due to inherent nonlinearity. The distortion of the nonlinear device is compensated by applying a predistorted signal to the input of the nonlinear device. The predistortion is chosen such that the distortion of the nonlinear device restores the undistorted signal.

BACKGROUND OF THE INVENTION

Directly modulating the analog intensity of a light emitting diode (LED) or semiconductor laser with an electrical signal is considered among the simplest methods known in the art for transmitting analog signals, such as sound and video signals, on optical fibers. Although such analog techniques have the advantage of significantly smaller bandwidth requirements than digital pulse code modulation, or analog or pulse frequency modulation, amplitude modulation may suffer from noise and non-linearity of the optical source.

Distortion inherent in certain analog transmitters prevents a linear electrical modulation signal from being converted linearly to an optical signal, and instead causes the signal to become distorted. These effects are particularly detrimental to multi-channel video transmission which requires excellent linearity to prevent channels from interfering with each other. A highly linearized analog optical system has wide application in commercial TV transmission, CATV. interactive TV, and video telephone transmission.

Linearization of optical and other nonlinear transmitters has been studied for some time, but proposed solutions suffer from practical disadvantages. Most applications have bandwidths which are too large for practical use. Feedforward techniques require complex system components such as optical power combiners and multiple optical sources. Quasi-optical feedforward techniques suffer from similar complexity problems and further require extremely well-matched parts.

One method employed in the past to reduce distortion inherent in nonlinear devices has been predistortion. In this technique, a modulation signal is combined with a signal equal in magnitude to the distortion inherent in the nonlinear device but opposite in sign. When the nonlinear device modulates the combined signal, the device's inherent distortion is cancelled by the combined signal's predistortion and only the linear part of the source signal is transmitted.

This predistortion signal is usually in the form of additive and subtractive combinations of the input fundamental frequencies as these intermodulation products constitute the most fertile source of distortion in analog signal transmission. In the distribution of AM signals for cable television, for example, there are often as many as 40 frequencies on a particular band and plenty of opportunities for second order and third order intermodulation products of those frequencies.

Current predistortion techniques generally divide an input signal into two or more electrical paths and generate predistortion on one or more of the paths resembling the distortion inherent in the nonlinear transmitting device. The generated predistortion is the inverse of the nonlinear device's inherent distortion and serves to cancel the effect of the device's inherent distortion when recombined with the input signal.

Attenuation can be used to match the magnitude of the predistortion to the magnitude of the device's inherent distortion characteristics before the signals are recombined and sent to the nonlinear device for modulation. However, the method suffers from crudeness because nonlinear devices frequently have amplitude and phase distortion characteristics dependent on the frequency of the modulating signal. Present techniques provide no means for compensating for these frequency-dependent nonlinearities Neglecting to correct for the frequency dependence of the distortion leads to a result which may be quite tolerable for many systems and for signals with relatively narrow bandwidth. However, they become particularly troublesome when converting an electrical TV signal to an optical signal for cable transmission. Such signals for cable TV may have forty or more input frequencies, all of which need to have high quality amplitude modulated signals. The transmission devices for such signal must have an exceptionally high degree of linearity. The bandwidth used for TV transmission and the like is becoming quite large and the predistortion techniques presently available are inadequate to cover the broad band with desired lack of distortion. Compensation for higher order intermodulation products and over a broad frequency range is, therefore, desirable.

The present invention accordingly is addressed to these and other difficulties found in the prior art.

SUMMARY OF THE INVENTION

Thus, in practice of this invention according to a presently preferred embodiment, a predistortion circuit for reducing distortion in the transmission of analog signals splits an input modulation signal into three electrical paths, one primary, one even order secondary and one odd order secondary. A predistortion amplifier in the even order secondary path generates second order intermodulation distortion products of the input signal. A predistortion amplifier in the odd order secondary path generates third order intermodulation distortion products of the input signal.

The distortion so generated, or predistortion, in each secondary path is adjusted to be substantially equal in magnitude and opposite in sign to the distortion inherent in a nonlinear modulation device to which the signal is applied. The predistortion signals are adjusted in amplitude and phase to match the frequency dependence of the distortion by the nonlinear device. The phase of the signals are synchronized by a delay or phase adjustment element in each of the electrical paths. The primary and secondary signals are then recombined to produce a single modulation signal including intermodulation product distortion.

The phase in the even order secondary electrical path is adjusted at both a high frequency within the frequency range of the circuit and at an intermediate frequency. Thus, the predistortion circuit largely linearizes the transmission of modulating signals by cancelling distortion inherent in nonlinear transmitting devices over a broad frequency range.

BRIEF DESCRIPTION OF THE DRAWINGS

These and other features and advantages of this invention will be better understood and more fully appreciated by reference to the following detailed description when considered in conjunction with the accompanying drawings, wherein:

FIG. 1 is a block diagram showing a first embodiment of a predistortion circuit;

FIG. 2 is a block diagram of a push-push amplifier employed in the predistortion circuit according to a preferred embodiment of this invention;

DETAILED DESCRIPTION

Figure 4:
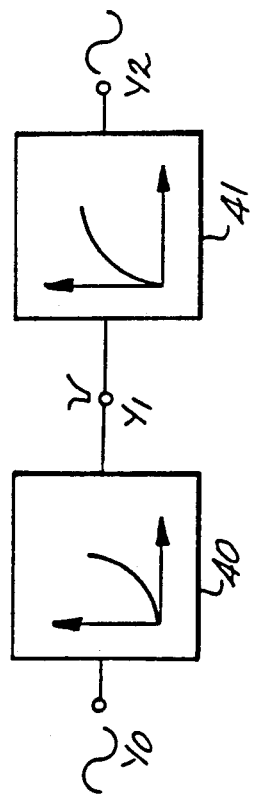
FIG. 4 is an illustration of the effect of predistortion on the waveforms of a modulation signal.

The concept of predistortion is shown abstractly in FIG. 4. An input signal $Y_0$ is input to a predistortion network 40. The predistortion network has a nonlinear transfer function which deviates from linearity oppositely and inversely from the deviation of a nonlinear transmitter having a known transfer function 41. The signal $Y_1$ from the predistortion network is a combination of the input source signal $Y_0$ and predistortion resulting from the nonlinear transfer function 40. Signal $Y_1$ is fed into the nonlinear transmitter and, after modulation by the transmitter, appears as a substantially linear signal $Y_2$ as a result of the inherent distortion of the transmitter inversely related to and cancelled by the predistortion of signal $Y_1$.

Referring now to FIG. 1, an input source signal 12 feeds into a directional coupler 10 and is split into a primary electrical path 13 and a secondary electrical path 1440. Typically, the portion of the signal on the primary electrical path is substantially larger in power than the signal on the secondary electrical path. For example, an 11 dB directional coupler may be used to achieve this result.

The secondary electrical path comprises in circuit series a distortion generator 15, an amplitude adjustment block 17, a "tilt" or frequency adjustment block 19, and a fine phase adjustment block 21. These elements may be varied in sequence along the secondary electrical path without departing from the functional purpose of the invention.

In one embodiment, the signal on the secondary electrical path feeds first into the distortion generator. The output of the distortion generator comprises intermodulation distortion of the input frequencies. Second order or second and higher order distortion may be produced. Ideally, the fundamental frequency is suppressed in the distortion generator by cancellation, filtering or other means. The intermodulation product so generated is opposite in phase to the input signal. This inversion may be accomplished within the distortion generator or with a separate inverter element (not shown).

The distorted output from the distortion generator is matched in magnitude to the magnitude of inherent distortion predicted in the transmission device (not shown in FIG. 1) receiving the output signal 25. The matching function occurs in the amplitude adjustment block 17 and this adjustment may be accomplished manually with a variable attenuator or dynamically with an automatic gain control element, for example. The output of the amplitude adjustment block 17, therefore, comprises intermodulation distortion of a small portion of the input signal and is substantially equal in magnitude and opposite in sign to distortion inherent in a nonlinear transmission device receiving the output signal 25 of the predistortion circuit. This output or predistortion signal effectively reduces the frequency independent component of the distortion of the nonlinear device.

Generation of the predistortion signal on the secondary electrical path typically involves a time delay relative to the primary electrical path. Before the primary and secondary paths are recombined an adjustment is made to set the relative phase of the primary path electrical signal with respect to the phase of the secondary path electrical signal which results in best cancellation of the distortion inherent in the nonlinear device. This phase matching is done on the primary electrical path by an external delay 23 which receives the primary portion of the signal 13 split by the directional coupler 10. The time delay may be manually or automatically adjusted. An exemplary delay may be simply a transmission line of selected length to introduce a suitable delay.

An exemplary transmission device may be a semiconductor laser or LED modulated by the output signal. The inherent distortion of such a device is not independent of frequency. Generally speaking, the distortion is inherently greater at higher frequencies.

To adjust for frequency dependent distortion of the nonlinear transmitting device, the output of the amplitude adjustment block is then fed into a frequency adjustment or "tilt" adjustment block 19. The tilt adjustment is a variable filter or other similar means which increases the amplitude of the distortion at high frequencies for an "up-tilt" and decreases it at high frequencies for a "down-tilt." This adjustment, like the amplitude adjustment, may be done either manually or automatically. By passing more or less of the high frequency distortion products than the low-frequency distortion products, the tilt adjustment enables the predistortion signal to be tailored more precisely to the inherent distortion characteristics of the nonlinear device.

Typically, the amplitude adjustment is made to compensate for the distortion occurring at the low frequency end of the band. The frequency adjustment is then made as an up-tilt to compensate for distortion at the high frequency end of the band. It may be noted that this same effect can be achieved by amplitude adjustment at the high frequency end, and an up-tilt or down-tilt on the low-frequency end as an appropriate attenuation or amplification of the signal.

An additional fine phase adjustment block 21 on the secondary electrical path provides for more accurate setting of the relative phase between the distortion generated in the secondary path and the distortion inherent in the nonlinear device. This adjustment, like the amplitude adjustment, may also be made manually and may be frequency dependent. It is found that manual adjustment of amplitude, frequency and phase is usually completed in less than a minute. What one does is make the appropriate adjustment while observing the distortion in the output of the nonlinear device. The adjustment seeks to minimize the final distortion. The optimum adjustment is when the predistortion signal is of the same magnitude as the distortion inherent in the nonlinear device, and the predistortion is exactly 180° out of phase with the distortion.

It is significant that the phase adjustment is made relative to the distortion of the device. Previously time delays have been introduced so that the predistortion is exactly in phase (or 180° out of phase) with the primary signal. This may be sufficient for some purposes, but is not suitable for others, such as TV bandwidth modulation of a laser, for example.

Once the relative phases of the signals on the primary and secondary electrical paths have been set, they are recombined by the output directional coupler 11. The combined signal 25, including the predistortion component from the secondary path, is output to a nonlinear transmission device for modulation of the signal.

An example of a predistorter or distortion amplifier block 15 is shown in detail in FIG. 2. A portion of the input signal 14 on the secondary electrical path is fed into a 180° splitter 30 which divides the signal into a first electrical path 38 and a second electrical path 39 of equal magnitude and opposite sign. If desired, the signals so divided need not be of equal magnitude if subsequently amplified or attenuated.

The first electrical path feeds into a first amplifier 32 generating second order and higher order intermodulation products of the fundamental frequencies in the input signal 14. The second electrical path, carrying a signal opposite in sign to the first electrical path, feeds into a second amplifier 33 generating even order intermodulation products which are of the same sign as those output by the first amplifier 32, but generating odd order intermodulation products opposite in sign to those output by the first amplifier. The signals are combined additively by a 0-degree combiner 34 which substantially reduces the fundamental frequencies and odd order intermodulation products, leaving even order intermodulation product components in an output signal 37. Ideally, this process produces pure second order and higher order even components of intermodulation distortion.

The first and second amplifiers 32 and 33 are adjustable to prevent complete cancellation of the odd order intermodulation product components. This adjustment can be accomplished by varying the bias currents to the amplifiers which has little effect on gain of the fundamental frequencies. An increase in the bias current of the first amplifier 32 with a corresponding decrease in the bias current of the second amplifier 33 will unbalance the two amplifiers in the sense that the magnitude of intermodulation products produced will no longer be identical between the two amplifiers. Thus, the odd order intermodulation products will not cancel one another.

The unbalancing of this distortion circuit, which is referred to as a push-push amplifier, allows generation of intermodulation distortion of all orders of interest for predistortion purposes. The fundamental frequencies may be suppressed by particular amplifier design or by filtering means (not shown), either in series with, after or integral to each amplifier. Preferably, the bias currents of both amplifiers 32 and 33 are adjusted in equal and opposite directions or senses, so that the unbalance affects only the odd order intermodulation products and the even order intermodulation products remain balanced and substantially unchanged in magnitude.

Figure 3:
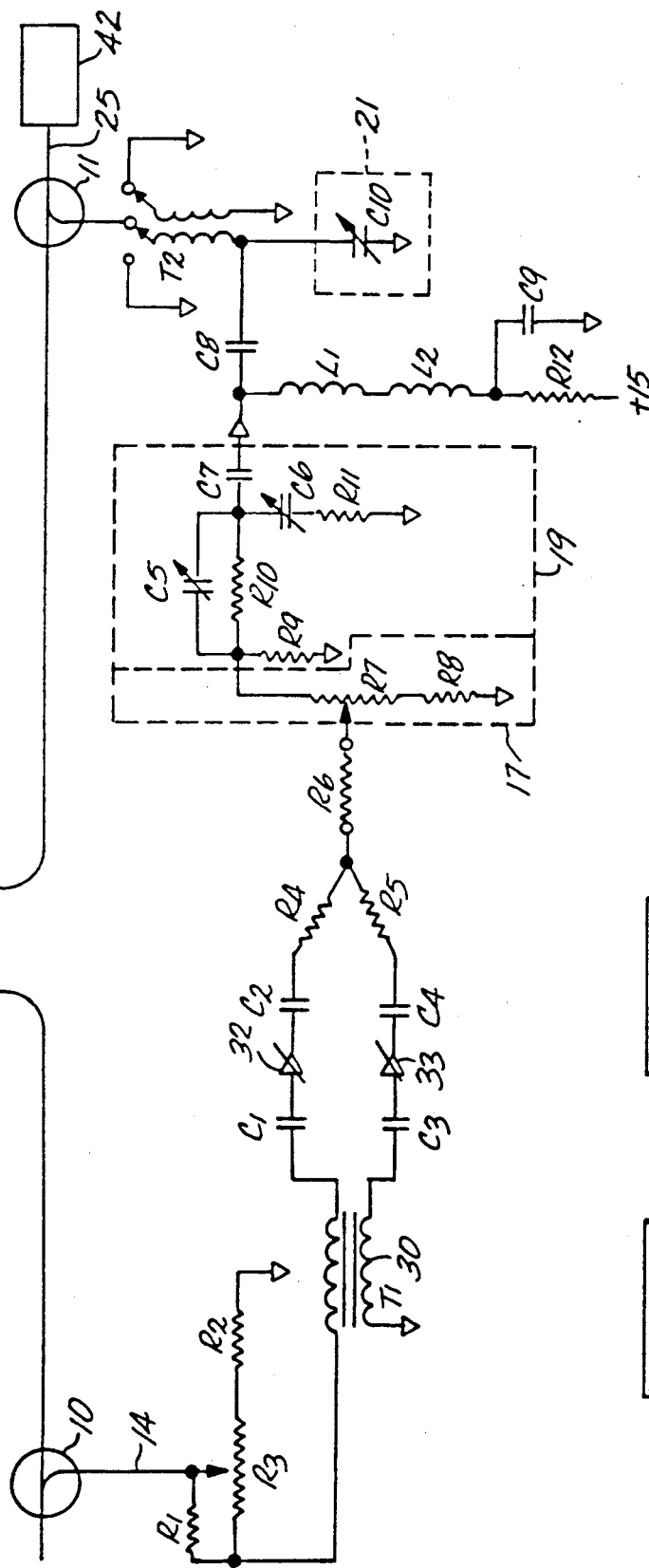
FIG. 3 is a schematic diagram exemplifying a practical predistortion circuit.

One embodiment of the predistortion circuit is shown in FIG. 3. The signal 14 in the secondary path from the signal splitting coupler 10 is first attenuated by way of an adjustable attenuator $R_1$, $R_3$ to assure a constant signal level. If the signal is too small there may not be sufficient distortion to compensate for the distortion of the transmission device. Conversely, if the signal is too large, the distorter could be overloaded and itself produce unacceptable distortion.

The attenuated signal is split in the 180° splitter 30, and capacitively coupled to the first and second amplifiers 32 and 33. The bias of the amplifiers is adjusted to obtain the desired third order and higher order intermodulation products, and the recombined signal is attenuated by way of the amplitude adjustment 17 to obtain the desired amount of distortion at relatively low frequencies, such as 50 MHz. Next one checks the higher frequency end of the band and adjusts the frequency filter 19 until the distortion matches the inherent distortion of the transmission device at this higher frequency. This has little effect on the predistortion at the lower frequency end of the band. It, in effect, tilts the amplitude as a function of frequency around a pivot near the low end of the band.

The time delay 23 is adjusted at the high frequency end of the band to adjust the phase of the signal in the primary signal path. Again, this has little effect at the low frequency end of the band. Finally, the phase adjustment 21 is used to more precisely adjust the phase of the predistortion generated in the secondary path to compensate for the phase distortion by the nonlinear device. If need be, the adjustment sequence can be repeated to more closely match the inherent distortion of the transmission device. Ordinarily, the initial attenuator and the bias of the predistortion amplifiers need not be adjusted, but may remain in a preset state. The three adjustments of the amplitude, tilt, and phase are sufficient. The principal delay in the primary path may also be fixed for a given secondary path.

The signal in the secondary path is recombined with the signal in the primary path by way of the directional coupler and the signal 25 thereby predistorted is applied to a laser 42 or the like for modulation.

Figure 5:
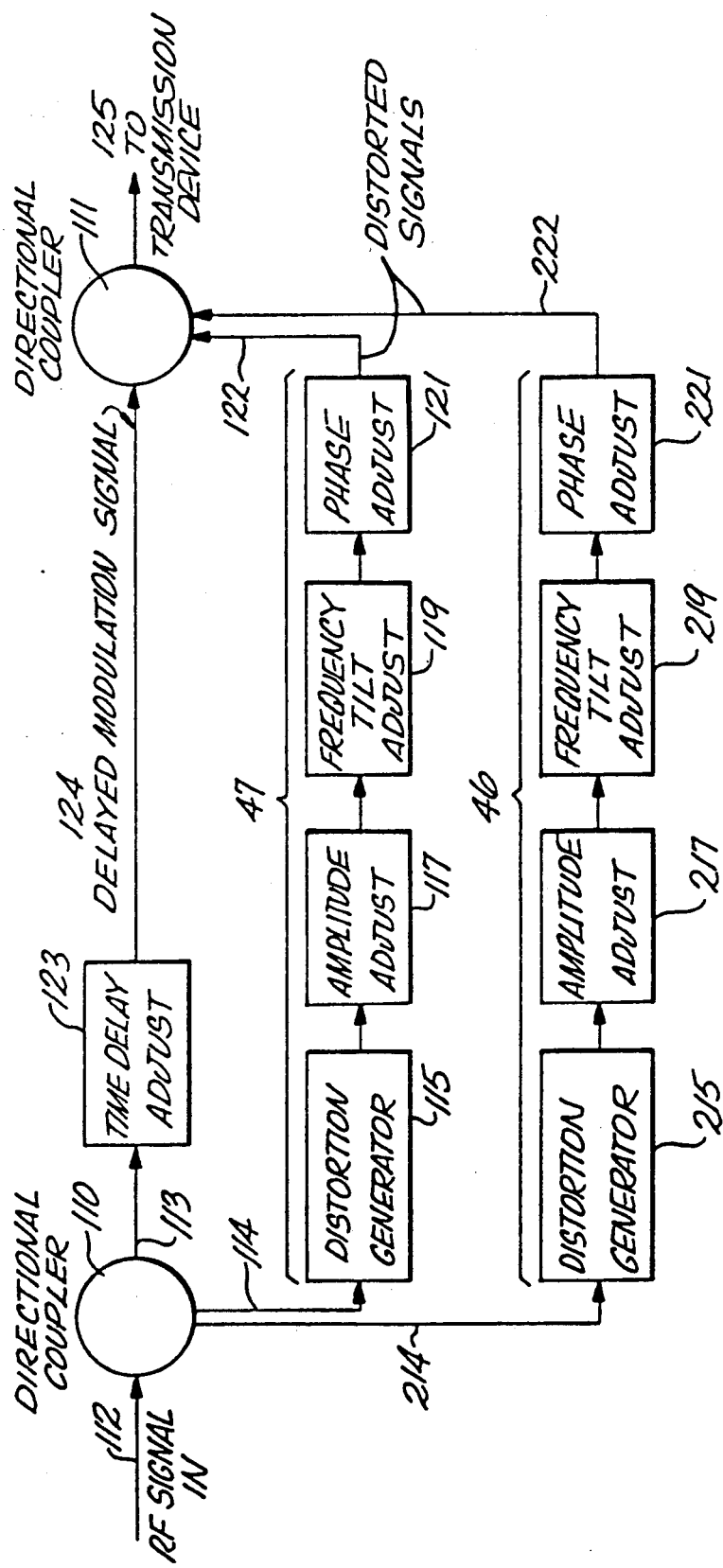
FIG. 5 is a block diagram snowing a predistortion circuit with more than one "secondary" path.

In the previously described embodiment, there is a single secondary signal path with its distortion generator. If desired, as shown in FIG. 5, a third "secondary" path 46 could be employed with one path 47 generating second order cancellation signals and another path 46 generating third order cancellation signals. In each of the secondary paths illustrated in FIG. 5, reference numerals are used which are 100 or 200 larger than the reference numerals used for like components in FIG. 1 of the drawings. Each of these paths may have its own adjustment for frequency dependence 119, 219 of amplitude and phase. In such an embodiment, it is preferred to have fine adjustment of phase 121, 221 in each of the secondary paths. In the event two or more secondary paths are used for high order distortion, the amplitude, tilt and phase in either path may be adjusted first since there is no interaction between them.

Figure 6:
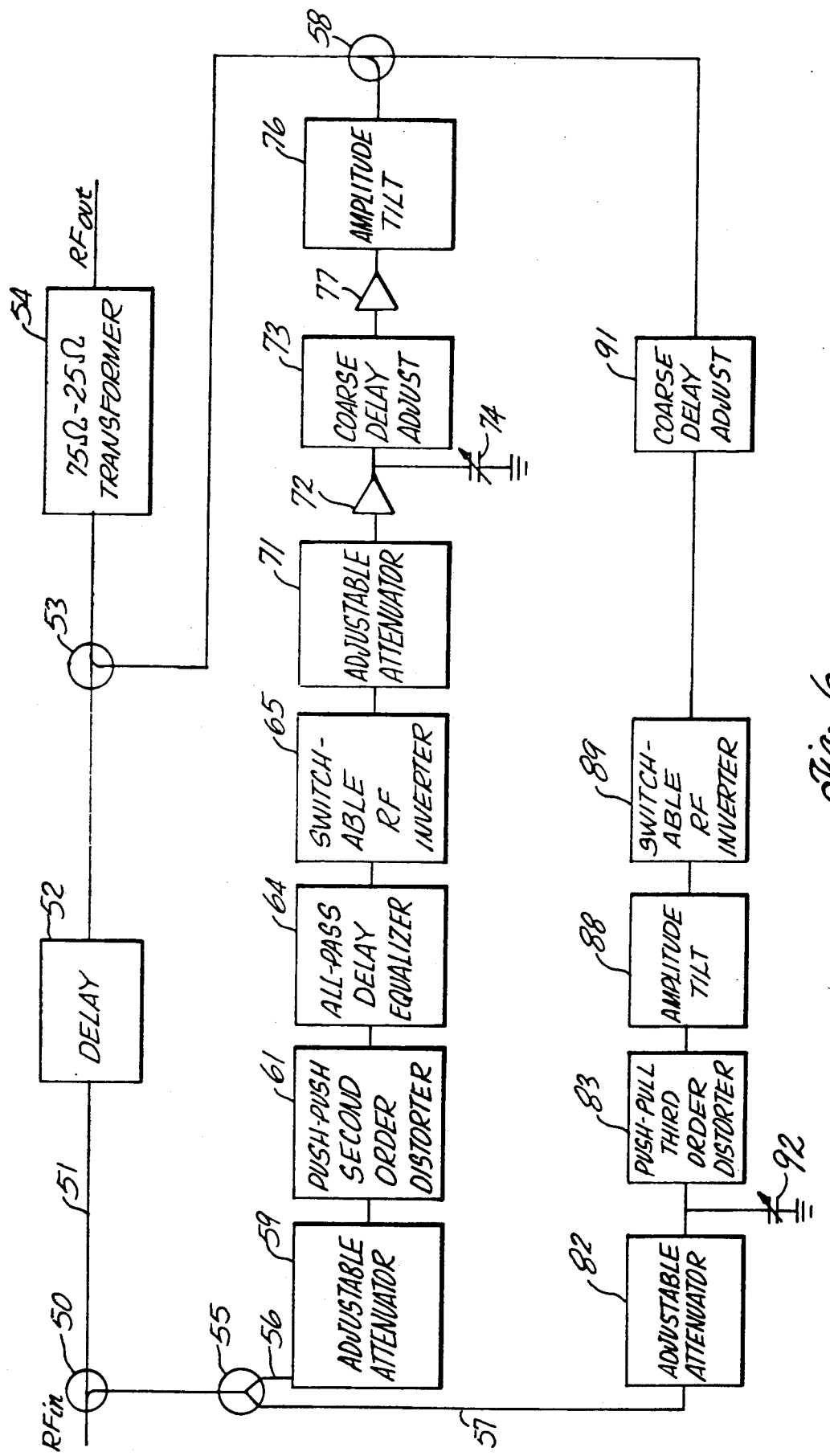
FIG. 6 is a block diagram of another embodiment of predistortion circuit useful over a broader frequency range.

An embodiment of predistortion circuit as hereinabove described and illustrated with a single secondary path has been designed for operation over a frequency range from 50 to 300 MHz, and it is found to be satisfactory for compensating distortion of an optical device over a range from 50 MHz to about 450 MHz. It is desirable, however, to cover a broader frequency range since there are television signals using a frequency band up to 860 MHz. Distortion at the high frequency end of such a band is significant, and the simpler circuit of FIGS. 2 and 3 may not be sufficient for the broader range. An improved predistortion circuit has, therefore, been provided for covering the broader range and is illustrated in FIG. 6.

As illustrated in this embodiment, the radio frequency (RF) input signal is applied to a coupler 50 which splits the signal, sending a principal portion of the signal along a primary electrical path 51 and a minor portion of the signal to a secondary electrical path. As in the previous embodiment, the primary electrical path includes a delay 52 which more or less matches the delay inherent in the secondary paths hereinafter described.

The signal in the primary electrical path is recombined with signals in secondary electrical paths with another coupler 53. The recombined signals thereby have a predistortion opposite to the inherent distortion in an output device (not shown), such as a laser. It is desirable to employ an impedance matching device 54, such as a 75 ohm to 25 ohm transformer, between the predistortion circuit and the active device being modulated.

The smaller magnitude signal from the input coupler 50 is split by a splitter 55 to an even order secondary electrical path 56 and odd order secondary electrical path 57. Means are provided in the even order secondary electrical path for producing second order intermodulation products which are adjusted to be equal and opposite to distortion in the output device. Means are provided in the odd order electrical path for producing third order intermodulation products equal and opposite to distortion in the output device. The second order and third order predistortion signals are combined in a coupler 58 and are, in turn, combined with the signal in the primary electrical path 51 by means of the coupler 53.

The even order electrical path comprises an initial adjustable attenuator 59. The adjustable attenuator, and other adjustable attenuators illustrated in FIG. 6, may be essentially the same as the attenuator $R_1$, $R_2$, $R_3$ illustrated in FIG. 3. The adjustable attenuator reduces signal strength to prevent overloading of a push-push second order distorter 61 to which the signal is applied.

Figure 7:
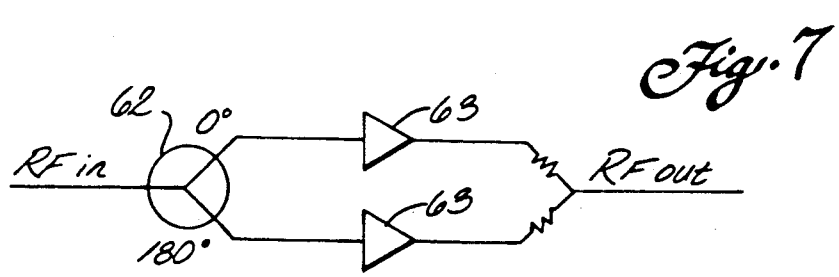
FIG. 7 is a circuit diagram of an exemplary push-push amplifier.

A suitable push-push distortion amplifier 61 is illustrated in FIG. 7. It comprises a 180° splitter 62 which divides the signal into two parallel electrical paths with signals of equal magnitude and opposite sign. Each of the split signals is applied to an identical amplifier 63. When the output signals from the amplifiers are recombined, they are 180° out of phase. As a consequence, the fundamental frequency is cancelled, as are odd order intermodulation products. The second order and higher even order intermodulation products are all that is left.

Figure 9:
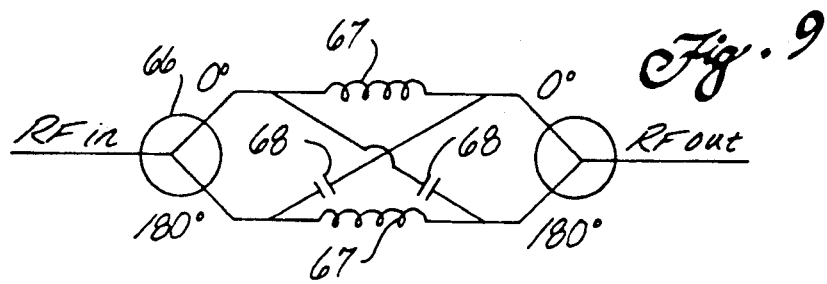
FIG. 9 is a circuit diagram or an exemplary all pass delay equalizer.

The second order product from the push-push distortion amplifier is applied to an all-pass delay equalizer 64, the circuit of which is illustrated in FIG. 9. The all-pass filter 64 comprises a 180° splitter 66 which splits the signal into equal and oppositely signed portions. Each of the signals from the splitter is applied to an inductor 67. The input to each of the inductors is connected to the output of the other inductor by a capacitor 68. The output signals are recombined in a 180° coupler 69. Such an all-pass filter has flat amplitude response, but provides a tailored phase delay as a function of frequency.

As mentioned hereinafter, the all-pass delay equalizer is used for adjusting phase of the second order intermodulation product signal in an intermediate frequency range. As a practical matter, rather than being continuously adjustable, a few "plug in" equalizers which provide an acceptable correction are used. In such an all-pass delay equalizer, increasing the inductance and capacitance increases the amount of correction in the mid-frequency range. In this device, the square root of the inductance over capacitance is held constant at about 50 ohms. If desired, a delay equalizer employing op-amps instead of the LC device may be used. The LC device is, however, inexpensive and convenient since only a few devices with differing characteristics need to be available to be plugged in for rapid adjustment.

The output of the delay equalizer 64 goes to a switchable RF inverter 65, to another adjustable attenuator 71 and, in turn, to a buffer amplifier 72. The inverter is used since the second order predistortion required for a particular output device may be positive or negative relative to the fundamental. The amplifier output is applied to a coarse delay adjustment 73, which typically is a plug-in length of coaxial cable. Differing delays may be achieved by plugging in different lengths of cable. A fine adjustment of delay is provided by a variable capacitance 74.

The output of the delay adjustment is applied to an amplitude tilt circuit 76 by way of a buffer amplifier 77. The output of the amplitude tilt goes to the coupler 58 for combination with a signal from the odd order secondary electrical path.

The delay adjustment and amplitude tilt adjustment are similar to those hereinabove described.

Figure 10:
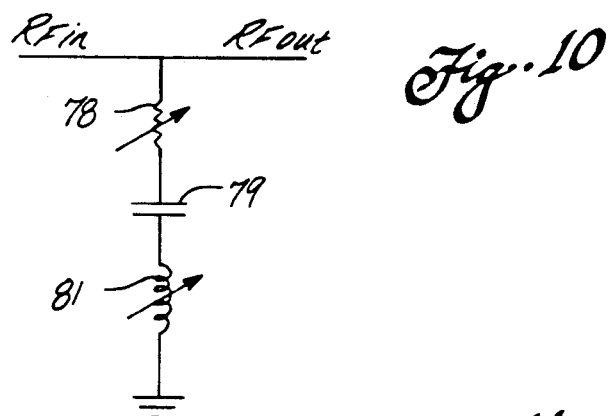
FIG. 10 is a diagram of an exemplary amplitude tilt circuit.

A suitable amplitude tilt circuit is illustrated in FIG. 10. Tilt is provided by connecting the signal line to ground by a variable resistor 78, capacitor 79 and variable inductor 81. As a practical matter, instead of using an inductor which may be varied, it is easy to use any of a few inductors of various values plugged in to change the tilt. A variety of capacitor values may also be plugged in for adjusting tilt.

The capacitor 79 is chosen for adjusting the phase of the signal near the low frequency end of the frequency range of the predistorter. This can be varied without significant changes in amplitude at the low end of the range. By choosing the values of the inductance and resistance appropriately, the amplitude of the distortion as a function of frequency can be set to match the device being linearized. Generally speaking, the high end amplitude is adjusted, then resistance in the tilt circuit can be changed for changing amplitude at the low end of the frequency range of the device. Changing inductance in the tilt circuit changes amplitude in mid-range.

Figure 8:
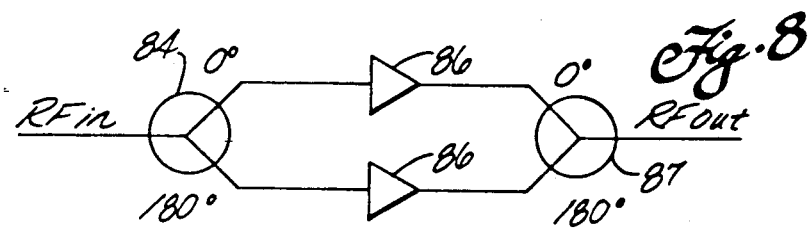
FIG. 8 is a circuit diagram of an exemplary push-pull amplifier.

The signal in the odd order secondary electrical path 57 goes to an adjustable attenuator 82, and thence to a push-pull third order distortion amplifier 83. A suitable push-pull circuit is illustrated in FIG. 8. In this circuit, the RF signal is split by a 180° splitter 84, and each resultant signal is applied to an identical amplifier 86. The amplifier outputs are recombined in a 180° coupler 87. Because of the phase inversion, the circuit results in the production of odd order intermodulation products, including the third order and the fundamental frequencies.

It is found that the magnitude of the third order distortion correction required is ordinarily quite low (e.g., 60 db down), and the magnitude of the fundamental expressed by way of the odd order secondary electrical path is trivial by comparison with the power in the primary electrical path. Thus, no special means for further suppressing the fundamental in the odd order path is ordinarily required.

For comparison, the second order signal is typically about 45 db down from the fundamental when recombined with the signal in the primary electrical path. The fourth order and higher order intermodulation products are of very low magnitude, typically more than 75 db down from the fundamental. These values, of course, vary with the device being compensated.

The output of the third order distortion amplifier is applied to an amplitude tilt adjustment 88, similar to what has already been described. The output of the tilt adjustment goes to a switchable RF inverter 89 which may be used for changing the polarity of the signal. This is employed since the third order predistortion required for a particular output device may also be positive or negative relative to the fundamental. The odd order secondary path also includes a coarse delay adjust 91 for adjusting the delay of the third order intermodulation products independently of the second order products before the two predistortion signals are combined at the coupler 58.

As previously indicated, the sequence of the circuit components along the secondary electrical paths is often of little significance. This is suggested in FIG. 6 by the position of the variable capacitor 92 for fine adjustment of the delay a couple circuit elements removed from the coarse delay adjustment. This just happens to be a convenient place for the fine adjustment in an exemplary device. Other of the circuit elements may also be placed in different sequences. Another example is the inverter for changing sign of the third order intermodulation products. This can be accomplished, for example, by switching input leads to the push-pull distortion amplifier. Other such variations will be apparent.

The improved predistortion circuit provides good correction of distortion over a broad frequency range because of a couple of additional features. One is the separate odd order secondary electrical path for generating third order intermodulation products. This permits use of a balanced push-push predistorter in the even order secondary electrical path for producing second order intermodulation products with essentially complete cancellation of fundamentals. Distortion introduced by the subsequent amplifiers in the even order path is thereby minimized. Secondly, the all-pass delay equalizer allows phase adjustment at an intermediate frequency in the frequency range of the predistortion circuit, in addition to the adjustment near high frequency end of the range.

Adjustment of the improved predistortion circuit is generally similar to the simpler circuit, but there are more steps and it take somewhat longer. A skilled operator can set the predistorter in three or four minutes. Each predistorter is adjusted to match the distortion inherent in the modulated device, since each such laser or the like has its own inherent distortion characteristics. In a particular apparatus, if the laser is changed, the predistorter may be readjusted to compensate for the new distortion. The adjustment is made by applying a known signal and observing the distortion of the output device. Adjustments are then made to reduce the distortion as seen in the output.

The general sequence of the adjustment commences with balancing the push-push amplifier to generate only second order distortion and suppress the fundamentals. Next, one balances the push-pull distortion amplifier to generate only third order predistortion. It is desirable at this point to determine the relative polarity of the second and third order distortions relative to the fundamental, and set the respective RF inverters.

The second order predistortion is usually adjusted first. One uses the adjustable attenuators and delay adjustments to cancel distortion at a relatively higher frequency near the high frequency end of the frequency range of interest. The distortion would ordinarily be nulled at a frequency somewhat below the end of the range. Next, one uses the amplitude tilt adjustment to null distortion near the low frequency end of the frequency range. Distortion near the upper end of the frequency range is checked and, if desired, the attenuator, delay and tilt adjustments may be repeated for further reducing distortion near the high and low ends of the range.

Next, one adjusts the all-pass delay equalizer for minimizing phase differences at an intermediate frequency within the range of the predistortion circuit. If appropriate, tilt may be adjusted again to optimize the mid-range amplitude. Distortion near the high and low frequencies ends of the range should then be checked and, if appropriate, the attenuator, delay and tilt adjustments may be repeated.

Figure 11:
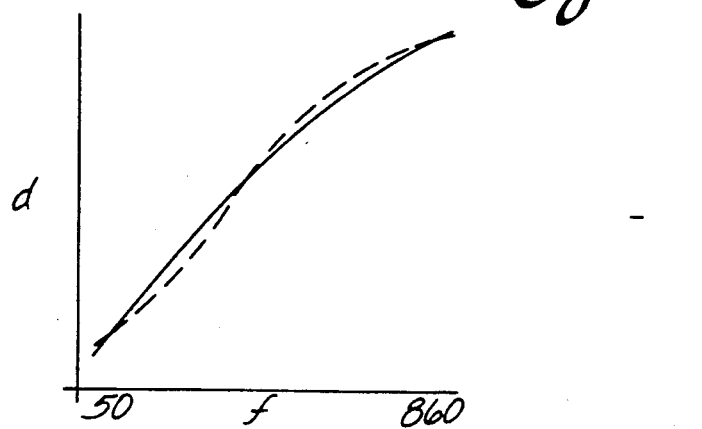
FIG. 11 is a schematic graph illustrating predistortion compensating distortion of a nonlinear device.

A result of the three-point adjustment may be visualized from the graph of FIG. 11 which schematically shows distortion d as a function of frequency f over a range from, for example, 50 to 860 MHz. A solid curve indicates an arbitrary level of distortion of either amplitude or phase which might be found in a nonlinear output device. A dashed curve is also drawn, illustrating nulling of the distortion at a relatively lower frequency near 50 MHz, at a relatively higher frequency near 860 MHz, and at some intermediate mid-range frequency. The dashed curve indicates the amount of predistortion which is subtracted from the inherent distortion. The final distortion of the output is then the difference between the two curves. It should be apparent that with the three-point cancellation of distortion, there is a smaller net distortion in the output than if the distortion is cancelled only near the upper and lower ends of the range.

After adjusting the even order secondary electrical path, the odd order path is adjusted. First, one adjusts the attenuator and delay elements to null the third order distortion near the high frequency end of the range. Next, one adjusts tilt to null distortion near the low frequency end of the range. The high frequency end is then checked, and these adjustments are repeated if necessary. Such adjustments may be repeated to get a desired linearity of the output device. Adjustment near the upper and lower ends of the range are adequate for most purposes and a mid-range adjustment would not normally be used in the odd order secondary path.

Where two secondary electrical paths are used for adjustment of the third order distortion separate from the even order path, the amplitude, tilt and phase in either path may be adjusted first, since there is no interaction between them. One generally adjusts the second order distortion first since it is ordinarily of larger magnitude.

In addition to compensating for distortion inherent in lasers or the like to produce a better TV signal, this technique is also valuable for permitting use of lasers which have larger inherent distortions than previously considered acceptable. Thus, for a given application of a laser, there will be a tolerable level of distortion. Any lasers that have excessive distortion may not be used. However, by applying suitable predistortion, otherwise unusable lasers may be salvaged, enhancing yield from the manufacturing process.

Many variations and modifications will be apparent to those skilled in the art without departing from the spirit and scope of the invention. For example, although described and illustrated in the context of a TV signal modulating a laser or light emitting diode, other nonlinear devices such as amplifiers may have inherent distortion largely cancelled by this technique.

Because of such variations, the invention may be practiced other than as specifically described.

What is claimed is:

1. A predistortion circuit comprising:
   means for splitting an input modulation signal for a nonlinear device into a primary electrical path, an even order secondary electrical path and an odd order secondary electrical path;
   means for generating second order intermodulation products in the even order secondary electrical path having a relative amplitude corresponding to the amplitude of distortion in the nonlinear device;
   means in series with the means for generating second order intermodulation products for adjusting the amplitude of the signal on the even order secondary electrical path as a function of frequency for providing frequency dependent predistortion on the even order secondary path;
   means for generating third order intermodulation products in the odd order secondary electrical path having a relative amplitude corresponding to the amplitude of distortion in the nonlinear device;
   means in series with the means for generating third order intermodulation products for adjusting the amplitude of the signal on the odd order secondary electrical path as a function of frequency for providing frequency dependent predistortion on the odd order secondary path;
   means for adjusting the relative phase of the intermodulation products in each secondary electrical path and the distortion of the nonlinear device; and
   means for additively recombining the primary and secondary paths into a single path to form a signal composed of the fundamental signal and frequency dependent intermodulation product predistortion for application to the nonlinear device.

2. A predistortion circuit as claimed in claim 1 wherein the means for generating intermodulation products in the even order secondary electrical path is a push-push amplifier and the means for generating intermodulation products in the odd order secondary electrical path is a push-pull amplifier.

3. A predistortion circuit as claimed in claim 1 further comprising means in the even order secondary electrical path for suppressing the fundamental frequencies.

4. A predistortion circuit as claimed in claim 1 wherein the means for adjusting phase in the even order secondary electrical path comprises:
   a first time delay in the even order secondary electrical path for compensating relative phase difference between the intermodulation products in the even order secondary electrical path and the distortion of the nonlinear device at a relatively higher frequency; and
   a second time delay in the even order secondary electrical path for compensating relative phase difference between the intermodulation products in the even order secondary electrical path and the distortion of the nonlinear device at a relatively lower frequency.

5. A predistortion circuit as claimed in claim 4 wherein the second time delay comprises an all-pass delay equalizer.

6. A predistortion circuit as claimed in claim 4 wherein the second time delay comprises:
   a 180° splitter for splitting a signal into first and second electrical paths;
   an inductor in each electrical path;
   a capacitor connecting the input of each inductor to the output of the other inductor; and
   a 180° combiner for recombining signals on the first and second electrical paths.

7. A predistortion circuit comprising:
   a first directional coupler for splitting an input modulation signal into a primary electrical path, an even order secondary electrical path and an odd order secondary electrical path;
   a distortion amplifier in the even order secondary electrical path for producing at least second order intermodulation products of the input frequencies:
   a distortion amplifier in the odd order secondary electrical path for producing at least third order intermodulation products of the input frequencies;
   a time delay in the primary electrical path for reducing the relative phase difference between the primary and secondary electrical paths;
   a second directional coupler for combining signals on the primary and secondary signal paths into a single signal for modulating a nonlinear device with predictable distortion characteristics; and
   a time delay in each of the secondary electrical paths for compensating relative phase difference between the intermodulation products in the secondary electrical paths and the distortion of the nonlinear device.

8. A predistortion circuit as claimed in claim 7 further comprising means in each secondary electrical path for adjusting the relative amplitude and phase of the signal in that path as a function of frequency such that the intermodulation signal is predistorted for offsetting a frequency dependent distortion of the nonlinear device.

9. A predistortion circuit as claimed in claim 7 wherein the distortion amplifier in the even order secondary electrical path is a push-push amplifier and the distortion amplifier in the odd order secondary electrical path is a push-pull amplifier.

10. A predistortion circuit as claimed in claim 7 wherein the primary electrical path carries a major portion of the input signal power.

11. A predistortion circuit for a broad signal frequency range comprising:
   a first directional coupler for splitting an input modulation signal into primary and secondary electrical paths;
   a distortion amplifier in series with the secondary electrical path for producing at least second order intermodulation products of the input frequencies;
   a time delay in the primary electrical path for reducing the relative phase difference between the primary and secondary electrical paths;
   a second directional coupler for recombining the primary and secondary signal paths into a single signal for modulating a nonlinear device with predictable distortion characteristics; and
   a first time delay in the secondary electrical path for compensating relative phase difference between the intermodulation products in the secondary electrical path and the distortion of the nonlinear device near the high frequency end of the frequency range; and
   a second time delay in the secondary electrical path for compensating relative phase difference between the intermodulation products in the secondary electrical path and the distortion of the nonlinear device in an intermediate portion of the frequency range.

12. A predistortion circuit as claimed in claim 11 wherein the second time delay comprises an all-pass delay equalizer.

13. A predistortion circuit as claimed in claim 11 wherein the second time delay comprises:
   a 180° splitter for splitting a signal into first and second electrical paths;
   an inductor in each electrical path;
   a capacitor connecting the input of each inductor to the output of the other inductor; and
   a 180° combiner for recombining signals on the first and second electrical paths.

14. A predistortion circuit for operation over a selected frequency range comprising:
   means for splitting an input modulation signal for a nonlinear device into a primary electrical path and a secondary electrical path;
   means for generating at least second order intermodulation products in the secondary electrical path having a relative amplitude corresponding to the amplitude of distortion in the nonlinear device;
   means for adjusting the relative phase of the nonlinear device at a low frequency in the range; and
   means for adjusting the relative phase of the intermodulation products and the distortion of the nonlinear device at an intermediate frequency in the range; and
   means for adjusting the relative phase of the intermodulation products and the distortion of the nonlinear device at a high frequency in the range; and
   means for additively recombining the primary and secondary paths into a single path for forming a signal composed of the fundamental signal and frequency dependent intermodulation product predistortion for application to the nonlinear device.

15. A predistortion circuit as claimed in claim 14 wherein the means for adjusting phase at the intermediate frequency comprises an all-pass delay equalizer.

16. A predistortion circuit as claimed in claim 14 wherein the means for adjusting phase at the intermediate frequency comprises:

a 180° splitter for splitting a signal into first and second electrical paths;
   an inductor in each electrical path;
   a capacitor connecting the input of each inductor to the output of the other inductor; and
   a 180° combiner for recombining signal son the first and second electrical paths.

17. A method for reducing distortion in an amplitude modulated signal from a nonlinear modulating device comprising the steps of:
   splitting an input modulation signal into a primary electrical path, an even order secondary electrical path and an odd order secondary electrical path;
   generating second order intermodulation distortion in the even order secondary electrical path and adjusting the magnitude of the intermodulation distortion to be equal in magnitude and opposite in sign to distortion inherent in a nonlinear modulating device;
   adjusting the amplitude and phase of the intermodulation distortion in the even order secondary electrical path as a function of frequency to match the frequency dependence of distortion inherent in the modulating device;
   generating third order intermodulation distortion in the odd order secondary electrical path and adjusting the magnitude of the intermodulation distortion to be equal in magnitude and opposite in sign to distortion inherent in a nonlinear modulating device;
   adjusting the amplitude and phase of the intermodulation distortion in the odd order secondary electrical path as a function of frequency to match the frequency dependence of distortion inherent in the modulating device; and
   recombining the electrical signal on the primary and secondary electrical paths, respectively, for providing an output signal with frequency dependent intermodulation predistortion for cancelling distortion in the nonlinear modulating device.

18. A method as recited in claim 17 comprising the steps of making the intermodulation distortion in each electrical path substantially equal in magnitude to the distortion of the nonlinear modulating device at a relatively lower frequency, and adjusting tilt to make the intermodulation distortion generated at a relatively higher frequency substantially equal in magnitude to the distortion of the nonlinear modulating device at the relatively higher frequency without substantially changing the magnitude of the intermodulation distortion generated at the relatively lower frequency.

19. A method as recited in claim 17 comprising the steps of making the intermodulation distortion in each electrical path substantially equal in magnitude to the distortion of the nonlinear modulating device at a relatively higher frequency, and adjusting tilt to make the intermodulation distortion generated at a relatively lower frequency substantially equal in magnitude to the distortion of the nonlinear modulating device at the relatively lower frequency without substantially changing the magnitude of the intermodulation distortion generated at the relatively higher frequency.

20. A method as recited in claim 17 comprising:
   adjusting phase of intermodulation distortion in the even order electrical path near the low end of a frequency range to be in phase with distortion in the nonlinear modulating device at such frequency;

adjusting phase of intermodulation distortion in the even order electrical path near the high end of the frequency range to be in phase with distortion in the nonlinear modulating device at such frequency; and adjusting phase of intermodulation distortion in the even order electrical path in an intermediate portion of the frequency range to be in phase with distortion in the nonlinear modulating device at such frequency.

21. A predistortion circuit comprising:

means for splitting an input modulated signal for a nonlinear device into a primary electrical path and a secondary electrical path;

means for generating at least second order intermodulation products in the secondary electrical path having a relative amplitude corresponding to the amplitude of distortion in the nonlinear device and for suppressing fundamental frequencies of the modulated signal;

means in series with the means for generating intermodulation products of the modulated signal for adjusting the amplitude of the signal on the secondary electrical path for providing predistortion on the secondary path;

means for adjusting the relative phase of the intermodulation products and the distortion of the nonlinear device; and means for additively recombining the primary and secondary paths into a single path to form a signal composed of the fundamental signal and second order intermodulation product predistortion in phase with distortion of the nonlinear device for application to the nonlinear device.

22. A predistortion circuit as claimed in claim 21 wherein the means for generating intermodulation products comprises:

means for splitting the input signal into first and second electrical paths, said signals being equal in magnitude and opposite in sign;

first means in the first electrical path for generating positive intermodulation products of the signal carried on the path;

second means in the second electrical path for generating positive even order intermodulation products and negative odd order intermodulation products of the signal carried on the path; and signal combining means for additively recombining the first and second electrical paths after the intermodulation products have been generated, thereby at least partially cancelling the odd order intermodulation product components.

23. A predistortion circuit as claimed in claim 22 further comprising means for unbalancing the first and second generating means such that cancellation of the odd order intermodulation products is not complete, thereby producing a predistortion signal comprising even an odd order intermodulation products.

24. A predistortion circuit for producing second order intermodulation products of frequencies in an input signal comprising:

means for splitting the input signal into first and second electrical paths, said signals being equal in magnitude and opposite in sign;

first means in the first electrical path for generating positive intermodulation products of the signal carried on the path;

second mean sin the second electrical path for generating positive even order intermodulation products and negative odd order intermodulation products of the signal carried on the path; and signal combining means for additively recombining the first and second electrical paths after the intermodulation products have been generated, thereby at least partially cancelling the odd order intermodulation product components.

25. A predistortion circuit as claimed in claim 24 further comprising means for unbalancing the first and second generating means such that cancellation of the odd order intermodulation products is not complete, thereby producing a predistortion signal comprising even and odd order intermodulation products.

26. The method of reducing distortion in a modulated signal from a nonlinear device comprising the steps of:

splitting an input signal into primary and secondary electrical paths;

generating at least second order intermodulation distortion in the secondary electrical path and adjusting the magnitude of the intermodulation distortion to be equal in magnitude and opposite in sign to distortion inherent in a nonlinear device;

suppressing fundamental frequencies of the modulation signal in the secondary electrical path;

adjusting the amplitude and phase of the intermodulation distortion in the secondary electrical path to match the distortion inherent in the nonlinear device; and recombining the electrical signals on the primary and secondary electrical paths, respectively, for providing an output signal with intermodulation predistortion for cancelling distortion in the nonlinear device.

27. A method as recited in claim 26 wherein the intermodulation distortion is made substantially equal in magnitude to the distortion of the nonlinear modulating device at a relatively lower frequency, and tilt is adjusted to make the intermodulation distortion generated at a relatively higher frequency substantially equal in magnitude to the distortion of the nonlinear modulating device at the relatively higher frequency without substantially changing the magnitude of the intermodulation distortion generated at the relatively lower frequency.

28. A method as recited in claim 27 wherein the time delay of the signal in one of the paths is adjusted at a relatively higher frequency to be 180° out of phase with the distortion of the nonlinear device at the higher frequency.

* * * * *

UNITED STATES PATENT AND TRADEMARK OFFICE
CERTIFICATE OF CORRECTION

PATENT NO. : 5,132,639

DATED : July 21, 1992

INVENTOR(S) : Henry A. Blauvelt; Howard L. Loboda; John S. Frame

It is certified that error appears in the above-identified patent and that said Letters Patent is hereby corrected as shown below:

In the Claims:

Column 12, line 39, after "frequencies" change the colon to a semicolon.

Column 13, line 49, before "nonlinear" insert -- intermodulation products and the distortion of the --.

Column 14, line 6, change "signal son" to -- signals on --.

Column 16, line 10, change "mean sin" to -- means in --.

Signed and Sealed this

Fifth Day of October, 1993

*Attest:*

BRUCE LEHMAN

*Attesting Officer*  Commissioner of Patents and Trademarks